(12) United States Patent
Branch et al.

(10) Patent No.: US 6,519,160 B1
(45) Date of Patent: Feb. 11, 2003

(54) PULL TYPE LATCH MECHANISM FOR REMOVABLE SMALL FORM FACTOR ELECTRONIC MODULES

(75) Inventors: Scott M. Branch, Rochester, MN (US); David P. Gaio, Rochester, MN (US); Michael F. Hanley, Rochester, MN (US); William K. Hogan, Rochester, MN (US)

(73) Assignee: JDS Uniphase Corporation, San Jose, CA (US)

( * ) Notice: Subject to any disclaimer, the term of this patent is extended or adjusted under 35 U.S.C. 154(b) by 14 days.

(21) Appl. No.: 09/657,214

(22) Filed: Sep. 7, 2000

(51) Int. Cl.[7] ................................................. H05K 5/00
(52) U.S. Cl. ....................................................... 361/754
(58) Field of Search ................................. 361/752, 754, 361/759, 798, 799, 801; 211/41.17

(56) References Cited

U.S. PATENT DOCUMENTS

| | | | | |
|---|---|---|---|---|
| 5,971,780 A | * | 10/1999 | Youn | 439/160 |
| 6,149,465 A | * | 11/2000 | Berg et al. | 439/630 |
| 6,236,573 B1 | * | 5/2001 | Gundlach et al. | 361/801 |
| 6,246,576 B1 | * | 6/2001 | Sands et al. | 361/686 |
| 6,246,585 B1 | * | 6/2001 | Gunther et al. | 361/759 |
| 6,288,902 B1 | * | 9/2001 | Kim et al. | 361/725 |

* cited by examiner

*Primary Examiner*—David Martin
*Assistant Examiner*—Thanh S. Phan
(74) *Attorney, Agent, or Firm*—Allen, Dyer, Doppelt Milbrath & Gilchrist, P.A.

(57) ABSTRACT

A latch is controlled to latch and unlatch a device by using a portion of the insertion and extraction movement of the device being latched. The latch incorporates a pair of tongs. The ends or latching extensions of the tongs are positionable behind a latch bar, preventing the extraction of the latched device. The tongs are positioned under the control of an actuator or latch control member which is moved to latch or unlatch the latch. The actuator member is pushed into the host device once the device being latched is positioned in the desired position. The tongs respond to the pushing of the actuator member by spreading the input ends under the influence of connecting input links moreover, the latching extensions are pivoted toward each other, positioning the latching extensions in a latched position. The latch extensions are spread to release the latch and the latched device by pulling the actuator member, pulling the input links as well as the input ends of the tongs, and thereby pivoting the tongs. Whenever in the latched position, further movement of the actuator member in a latching direction will detent and lock the latch until the latch is undetented by pulling on the actuator member.

23 Claims, 5 Drawing Sheets

PULL TYPE LATCH MECHANISM FOR REMOVABLE SMALL FORM FACTOR ELECTRONIC MODULES

CROSS REFERENCE TO RELATED UNITED STATES PATENT APPLICATIONS

The following are related co-pending United States patent applications:

REMOVABLE SMALL FORM FACTOR FIBER OPTIC TRANSCEIVER MODULE CHASSIS, Ser. No. 09/489,870, filed Jan. 20, 2000, by Scott M. Branch, David P. Gaio and William K. Hogan;

REMOVABLE LATCH AND BEZEL EMI GROUNDING FEATURE FOR FIBER-OPTIC TRANSCEIVERS, Ser. No. 09/410,786, filed Oct. 1, 1999, by Scott M. Branch, David P. Gaio and William K. Hogan;

REMOVABLE SMALL FORM FACTOR FIBER OPTIC TRANSCEIVER MODULE AND ELECTROMAGNETIC RADIATION SHIELD, Ser. No. 09/489,184, filed Jan. 20, 2000, by Scott M. Branch, David P. Gaio and William K. Hogan; and PIVOTING TYPE LATCH FOR REMOVABLE ELECTRONIC DEVICES, Ser. No. 09/591,640, filed Jun. 9, 2000, by Scott M. Branch, Leland L. Day, David P. Gaio, Michael F. Hanley and William K. Hogan, which are incorporated herein in their entireties by this reference.

FIELD OF THE INVENTION

This invention relates to the field of connecting cables or other devices to computers and, more specifically, to the latching of connectors and connections together to ensure reliable service and uninterrupted data transmission and reception.

BACKGROUND OF THE INVENTION

Increasingly, computers and servers are being interconnected with other computers and servers to form communications and data networks. Prodigious amounts of data and other communications are transmitted and received over such networks and require reliable connection of coaxial or fiber-optic cables either to the computer/server or to interface devices connected to the computer/server to insure continued and uninterrupted connections. Networked computers or servers typically operate continuously, twenty four hours a day, to provide the services or data that a computer or server is intended to provide to the remote computers upon demand.

Easy connection/disconnection and reliable cable connections are necessary to permit rapid, easy and reliable changing of cables as needs arise. One approach, which is rapidly becoming a standard within the industry, utilizes a transceiver module to receive signals from the network cable and to transmit signals to the computer or server, or vice-versa. This type transceiver module may be designed in various versions, but all are compatible with the particular connector and port in a particular computer or server. Some transceivers can receive optical signals and output electronic signals to the computer and vice-versa. Other transceiver modules may be designed to receive electronic signals from the network cables and output or transmit computer compatible electronic signal and vice-versa. Transceiver modules are inserted into and connected to the data ports of a computer or server. The transceiver modules must be reliably latched into data ports and be retained against reasonable forces exerted on cables without being disconnected from the data ports. At the same time the latching of the transceiver modules must not be so resistive to unintentional disconnection forces that the transceiver module is damaged if the cables are pulled excessively.

The latching devices preferably are disposed on the transceiver modules so that these latching devices are removed from the host device whenever the transceiver module is removed. Therefore, the latch itself cannot be left in the data port, unprotected as such, and face the possibility of breakage from impacts or forces exerted thereon. Such breakage is a problem presented by designs wherein the latch mechanism is not removed from the data port whenever a transceiver module is removed. Remaining as part of the host device, a latch is obviously exposed to damage, as it will project from the host device without a protective device to shield the latch device.

The latch is designed and created to be an intentionally "weak link" in the retention apparatus to desirably protect the more expensive components from destructive forces, such as a transceiver module; those forces include those exerted by a person tripping over the cables or pulling excessively hard on the cables.

OBJECTS OF THE INVENTION

It is an object of the invention to latch a modular device into a predetermined position or receptacle relative to a host device.

It is another object to the invention to detent a latch to hold the latched device in a latched condition pending release of the detent.

It is a further object of the invention to positively drive the latching mechanism in both an unlatching and a latching movement.

It is an additional object of the invention to effect latching of the latch mechanism as a part of an inserting motion.

It is still another object of the invention to effect unlatching as part of an extracting movement.

It is a still further object of the invention for the latch mechanism to be easily replaceable on the device being latched to the host device.

Other objects of the invention will become apparent from a complete understanding of the structural and operational aspects of the invention provided by the attached drawings and the detailed description of the invention below.

SUMMARY OF THE INVENTION

The invention is a module carrying a latch mechanism embodying a pair of pivoted tongs or pivoted arms which serve to position distal portions of each tong behind and interfering with a latch bar whenever in a latched condition. The tongs are pivotally disposed relative to an axis fixed relative to the device being latched onto a latch bar. The tongs are formed to present the input end and the distal end on the same lateral side of a common pivot axis such that an opening movement of the input ends is opposite in direction to a corresponding opening movement of the distal ends, and the closing movement of the input ends, likewise, is opposite in direction to closing movement of the distal ends.

To control unlatching and latching, the input movement to the tongs is provided by a manually engageable and operable actuator member, otherwise referred to as a pull-tab. The actuator member is connected to a pair of input links through a post fixed to the actuator member which forms a common pivot axis for the input links. The input links are pivotable about the actuator member post and pivot axis and have further pivotable connections to the input ends of the tongs.

Whenever the actuator member is pulled or displaced away from the common pivot axis of the tongs, the displaced input links pull the input ends of the tongs closer together. This movement of the input ends of the tongs acts to pivot the tongs and spread the distal ends of the tongs and remove the latching extensions of the distal ends from interference with a latch bar. This permits the extraction of the module or device, being latched to the latch bar and the latching mechanism from the receiving port of the host device, typically a computer or server.

The latching of the latch mechanism is accomplished by placing the device to be latched into position within the host and pushing the actuator member inwardly toward the common tong pivot axis, which is fixed relative to the device to be latched. This pushing action displaces the actuator member and spreads the ends of the input links and the input ends of the tongs, moving the distal ends of the tongs closer together. The tongs deflection will allow the actuator member and input axis thereon to be moved past the dead center line interconnecting the input ends of the tongs and allow the actuator member to toggle over-center and detent the actuator in the latched and locked position, thereby locking the tongs in a locked position and preventing the removal of the transceiver module from the port in the host device.

This detenting of the actuator member in a latched and locked position positively blocks and locks the latch tongs in a latched condition until the latch mechanism is undetented by pulling the actuator member outwardly and past dead center.

A more complete understanding of the structure and operation of the latching mechanism of the invention may be gained from the attached drawings and the detailed description of the invention that follows.

DETAILED DESCRIPTION OF THE PREFERRED EMBODIMENT OF THE BEST MODE FOR CARRYING OUT THE INVENTION AS CONTEMPLATED BY THE INVENTORS

Figure 1:
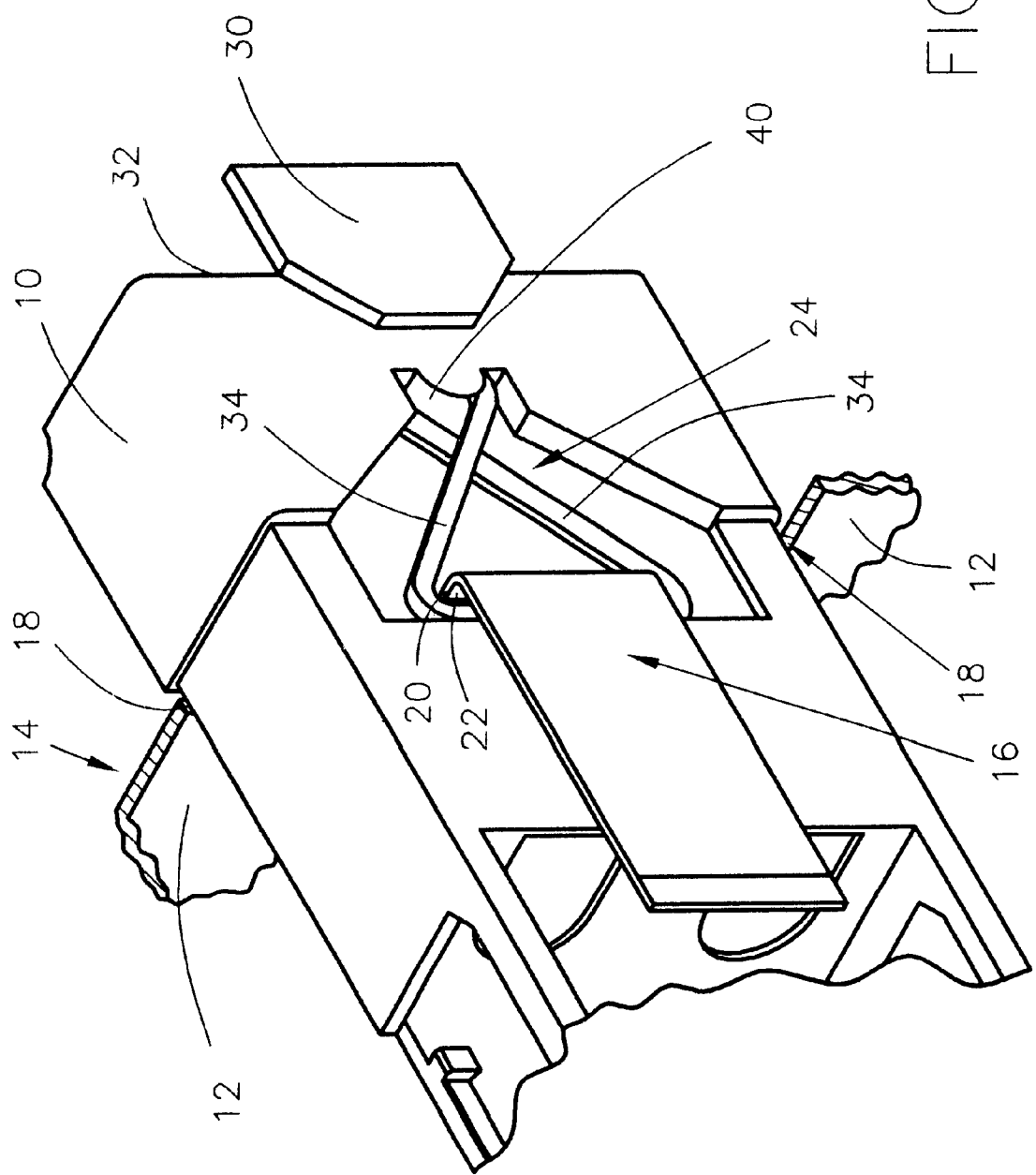
FIG. 1 is a bottom isometric view of an electronic module carrying the latch mechanism of the invention disposed relative to a latch bar.

Refer initially to FIG. 1, a bottom isometric view of a transceiver module 10, insertable within a port 18 in a bezel or shield 12 of a host device 14, such as a computer or server, is illustrated. The host device 14 also includes a retainer member 16 or latch bar 16 supported by a portion of the host device 14. The support may be on an electromagnetic radiation interference shield on a circuit board or a portion of the housing in the host device. Retainer member 16 preferably is a relatively rigid cantilevered beam structure which extends toward port 18 in bezel 12. Retainer member 16 includes a generally upwardly extending flange 20 having a surface 22 which functions as a latch surface 22 or retention surface 22 against which the latching extensions 36 (best seen in FIG. 3) of tongs 34 engage to hold the transceiver module 10 in connection with the host device 14.

The transceiver module 10 is replaceable within the host device 14, to change transceiver module types or to replace damaged modules, by unlatching the latch mechanism 24 and removing the transceiver module 10 from the host device 14 and inserting another similar transceiver module 10, of the same or different type, in its place and relatching the replacement module. Due to the small size of the transceiver module 10, push-to-release latches are counter-productive as their unlatching action tends to further seat a transceiver module 10 in port 18 and, thus, does not contribute to an extraction or removal operation. Additionally, the use of a push-to-release latch additionally requires a kick-out spring to eject a device once it is unlatched, to insure the latch does not relatch upon release of the push-to-release control. The tong 34 arrangement and its pulling action eliminates the need for such a kick-out spring as will be discussed later in this description.

The transceiver module 10 carries the latch mechanism 24 for engagement with the retainer member 16 to accomplish latching. If broken or disabled, the latch mechanism 24 is easily repairable by the operator simply by replacing the inexpensive latch mechanism parts which furthermore eliminates the need for expensive service personnel and a service call and allows quicker return to service.

The pull-tab 30 or actuator member 30 of latch mechanism 24 fits within or slides relative to housing 32 of transceiver module 10 and manipulates tongs 34 to engage and disengage the tongs 34, and particularly the latch extensions 36 with and from the retaining surface 22 of latch bar 16. In conjunction with the pivot post 40, bends 38 form a pivot for tongs 34.

Accordingly, a pull-to-release latch mechanism is advantageous both from a human factors viewpoint and from an economic standpoint.

The transceiver module 10 is formed to create a slide channel 72 therein to accept the actuator member 30. The actuator member 30 is moveable within channel 72, relative to the transceiver module 10.

Figure 2:
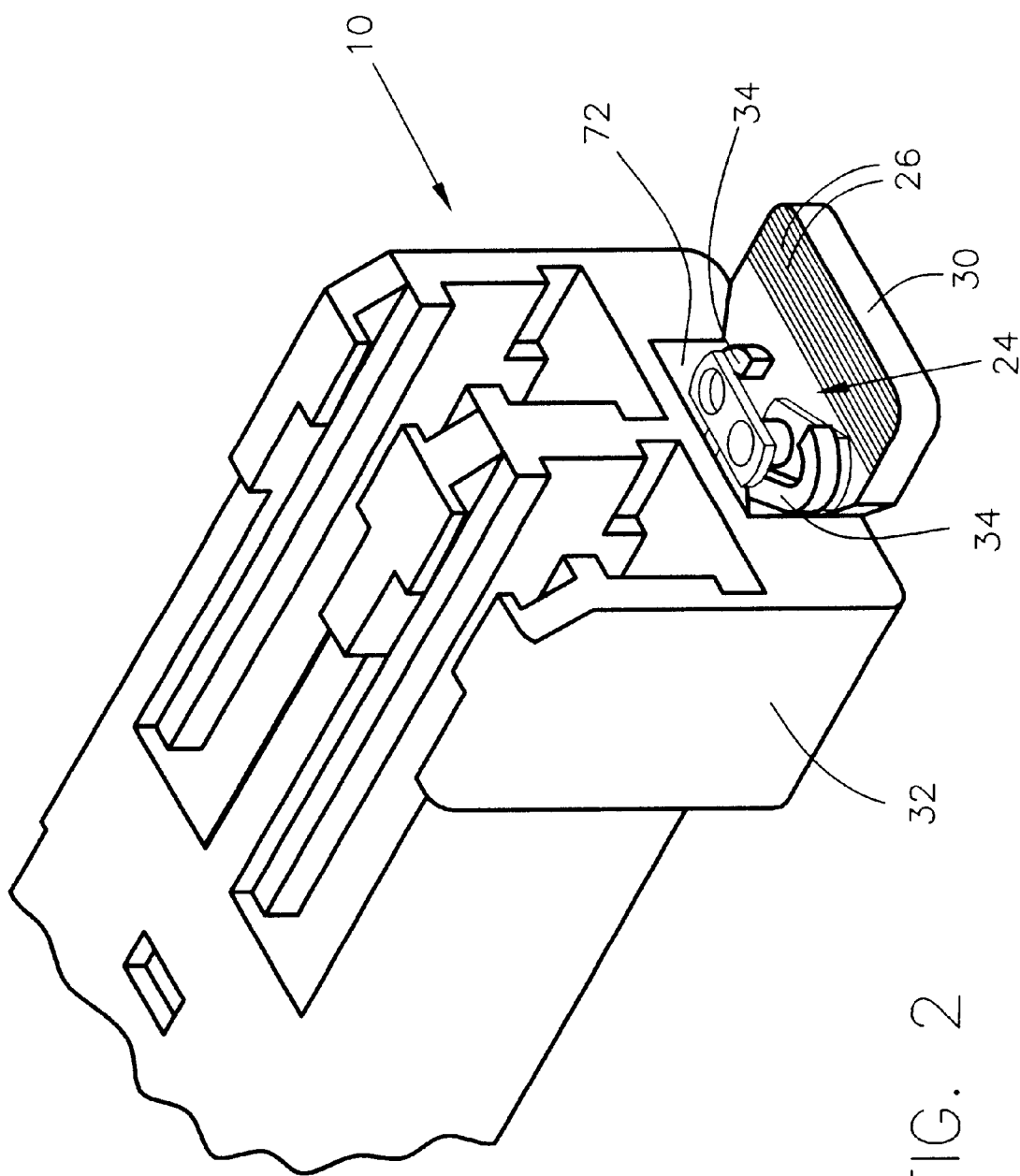
FIG. 2 is an elevated left isometric view of an electronic module carrying the latch mechanism.

Refer now to FIG. 2 with the front end of the transceiver module 10 and a portion of the latch mechanism 24 isometrically illustrated. Actuator member 30 may be provided with a surface advantageously adapted for grasping by the operator's fingertips, such as ridges 26 or other roughened areas 26. In lieu of ridges 26, the actuator member 30 may be roughened, checkered or provided with any number of various surface irregularity patterns. Ridges 26 are shown in FIG. 2 but are omitted in FIGS. 1 and 4 for simplicity.

Figure 3:
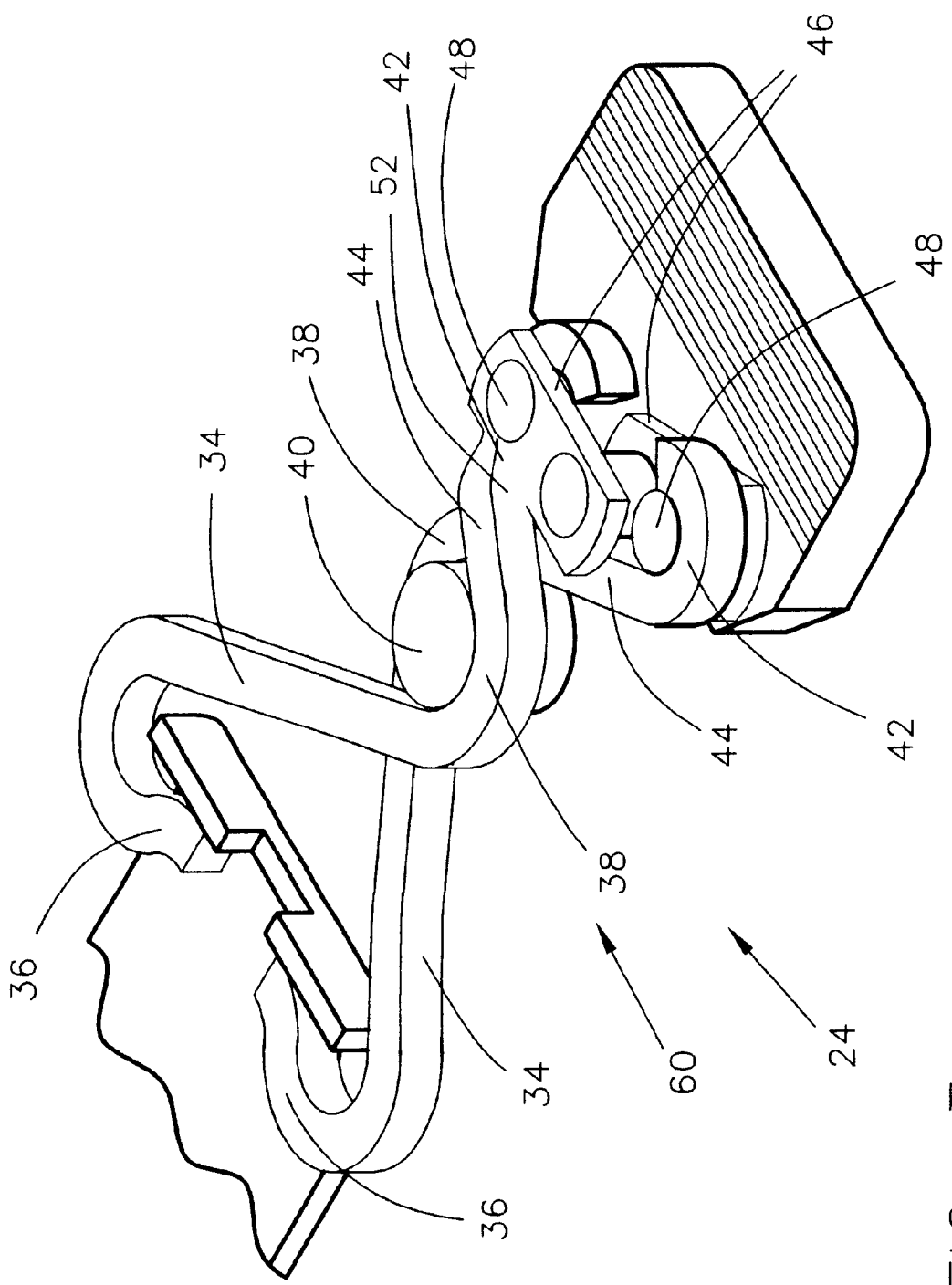
FIG. 3 is an elevated isometric view of the latch mechanism and latch bar illustrated with the latch mechanism removed from the device being latched.
Figure 4:
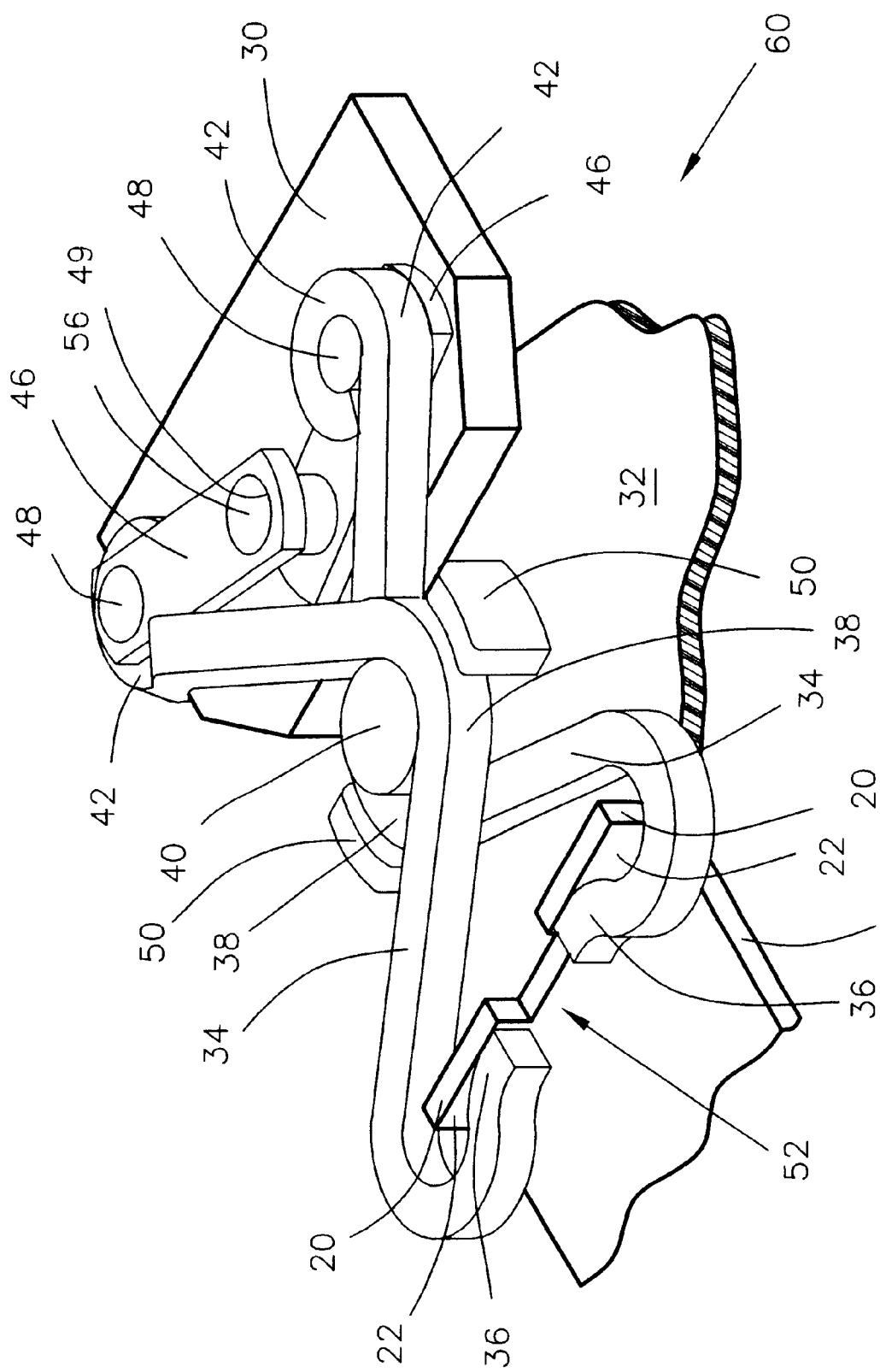
FIG. 4 is an elevated rear isometric view of the latching mechanism and latch bar with a fragment of the latched module.

Turning now to FIGS. 3 and 4, the latch mechanism 24 is illustrated, for clarity, without most of the transceiver module 10. Latch mechanism 24 is comprised of tongs 34 having latch extensions 36 disposed on the distal ends of tongs 34. Tongs 34 are further formed with bends 38. Bends 38 are formed with an inside radius substantially equal to or slightly larger than the radius of pivot post 40 which extends from the housing 32, best seen in FIG. 1. If desired, a backing member 50 may be formed or molded on the same surface of housing 32, a portion of transceiver module 10 (FIG. 1), that supports post 40. As will be discussed more fully below with reference to FIG. 5, tongs 34 may be provided with journals 70 to encircle post 40 and obviating the need for backing members 50.

In order to constrain the movement of links 34 or tongs 34 and, particularly, bends 38 to a pivoting movement about post 40, which insures that the input movement supplied to input ends 42 is efficiently translated into correlative movement of latch extensions 36, it may be necessary to confine the bends 38 closely to post 40. This confinement may be accomplished by any suitable means. One suggested approach is to form on housing 32, closely displaced from post 40, a pair of backing structures 50 with a sufficient spacing from the post 40 that the bends 38 of tongs 34 are slideably confined in close proximity to post 40. Accordingly, tongs 34 will effectively pivot about post 40 whenever input forces cause displacement of the input end 42 of input arms 44 of tongs 34.

Input ends 42 of input arms 44 on tongs 34 are associated with input links 46 which may be provided with a post 48. Each post 48 forms an axis about which input ends 42 of tongs 34 may pivot. Input ends 42 preferably may be formed with holes 49 which fit over post 48. Alternatively, (not shown), if input ends 42 and post 48 are integrally formed, then post 48 could be inserted into mating holes 49 formed in one end of input links 46. Relative movement between input links 46 and input ends 42 of tongs 34 is permitted by this post 48/hole 49 structure, not only allowing the input links 46 to be moved pivotally past dead center between posts 48 but also displacing the input ends 42 inwardly and outwardly.

As can be observed in FIGS. 2, 3 and 4, actuator member 30 or pull-tab 30 is connected to the input links 46 by post 56 about which input links 46 may pivotally move. The actuator member 30 and the post 56 are preferably integrally molded to produce a strongly supported post 56 and its axis 58.

With an understanding of the foregoing explanation of the structure of pull-to-release latch mechanism 24, the operation of the latch mechanism 24 will be described below.

With tongs 34 confined to slide past or pivotally around post 40, any movement of the input ends 42 of tongs 34 will result in a pivot-like motion of the tongs 34 with a related pivoting movement of latch extensions 36 to spread or close the gap 52 intermediate the latch extensions 36. This spreading or closing movement effects unlatching or latching, respectively, of the latch extensions 36 relative to retaining member 16 which serves as a latch bar 16; additionally, this action blocks extraction of the latch extensions 36 and, hence, the latch mechanism 24 without first spreading the latch extensions 36 to disengage the latch extensions 36 from the latch bar 16 and, particularly, the upturned flange 20.

In order to provide movement to the tongs 34, movement of input links 46 and their connections through posts 48 is required. Movement by posts 48 to reduce the distance between posts 48 will result in tongs 34 and, specifically, bends 38 being moved past post 40 in essentially a pivoting motion of the tongs 34. This pivoting motion of tongs 34 will cause spreading apart of latch extensions 36. Conversely, the spreading of the posts 48 will cause a corresponding pivoting movement of tongs 34 about post 48 to close the latch extensions 36 on each other.

By pulling on or moving pull-tab 30 or actuator member 30 outwardly away from post 40, input post 56, which is attached to pull-tab 30, is moved outwardly of transceiver module 10. Movement of input post 56 will force input links 46 to pull together the input ends 42 of tongs 34. Tong bends 38 and backing members 50 constrain tongs 34 to a pivoting motion about post 40 and the pivoting motion spreads latch extensions 36 apart as the input ends 42 of tongs 34 are moved toward each other.

The movement of the pull-tab 30 outwardly or away from post 40 will initially spread input ends 42 of tongs 34 until the axis of post 56 passes dead center relative to posts 48. If the latch extensions 36 are blocked from movement inwardly by latch bar 16 and flange 20 and during the undetenting of actuator 30, this initial spreading of the input ends 42 of tongs 34 is absorbed by minor flexural deformation or flexing of the tongs 34. Once passed dead-center, further movement of pull-tab 30 and input post 56 will pull input links 46 and cause posts 48 and input ends 42 of tongs 34 to be moved closer together. Such converging movement of posts 48 toward each other will cause a spreading of the latch extensions 36, to disengage the latch extensions from interference with latch surface 22 of restraining member 16.

Through the choice of the relative length between post 48 and post 40 and the length between post 40 and latch extensions 36, a multiplier effect may be achieved so that a small amount of movement of post 48 will result in a multiplied or magnified movement of latch extensions 36. Inasmuch as the tongs 34 are not loaded in any way at the latch extension 36 end, such larger movement is not difficult and does not overload the latch mechanism 24. Whenever input ends 42 are sufficiently pulled together by movement of actuator member 30 and input post 56, latch extensions 36 are spread to disengage from latch bar 16 and release the electronic module 10 for removal from the host device 14.

Latching of latch mechanism 24 is accomplished by forcing the electronic module 10 into the receiving receptacle (not shown) through the port 18 with the actuator member 30 fully extended and the latch extensions 36 of tongs 34 fully spread. With latch extensions 36 fully spread, the latch extensions 36 will pass the lateral ends of upturned flange portion 20 of the latch member 16. Whenever fully seated, electronic module 10 will resist further insertion forces and the actuator member 30 then be pushed inwardly toward post 40. Such inward movement of post 56 mounted on actuator member 30 will close the distance between input post 56 and post 40, spreading input ends 42 of tongs 34 through pivoting of input links 46. Through pivoting about pivot post 40, such spreading action translating into a closing movement of the latch extensions, thereby not only capturing the upturned flange 20 of latch member 16 and disposing latch extensions 36 in a position behind upturned flange 20 of latch member 16, but also preventing removal of the electronic module 10 from the port 18 so long as latch mechanism 24 remains latched.

Further movement of the actuator member 30 in an inward, latching direction will cause further spreading of the input ends 42 of tongs 34 permitting input links 46 to align and then pass dead-center. This over dead-center toggling action effectively detents the actuator member 30 and restrains it from extending and inadvertently unlatching the latch mechanism 24. Thus, the detenting of the actuator member 30 locks the latch mechanism 24 in its latching condition and prevents inadvertent disconnection of the data or other connections between the host device 14 and the electronic module 10 being latched to it.

The materials from which the latch tongs 34 are fabricated may be chosen and dimensions designed to insure that the weakest portion of the latch mechanism 24 is the region of the tongs 34 that support the latch extensions 36. Thus, the latch mechanism 24 can provide assured latching up to a predetermined force threshold and exceeding the force threshold will result in breaking the tongs 34. The broken tongs 34 then will release the electronic module 12.

Although disruptive, release of the electronic module 10 in this fashion prevents damage and breakage of more expensive assemblies, such as transceiver module 10.

Figure 5:
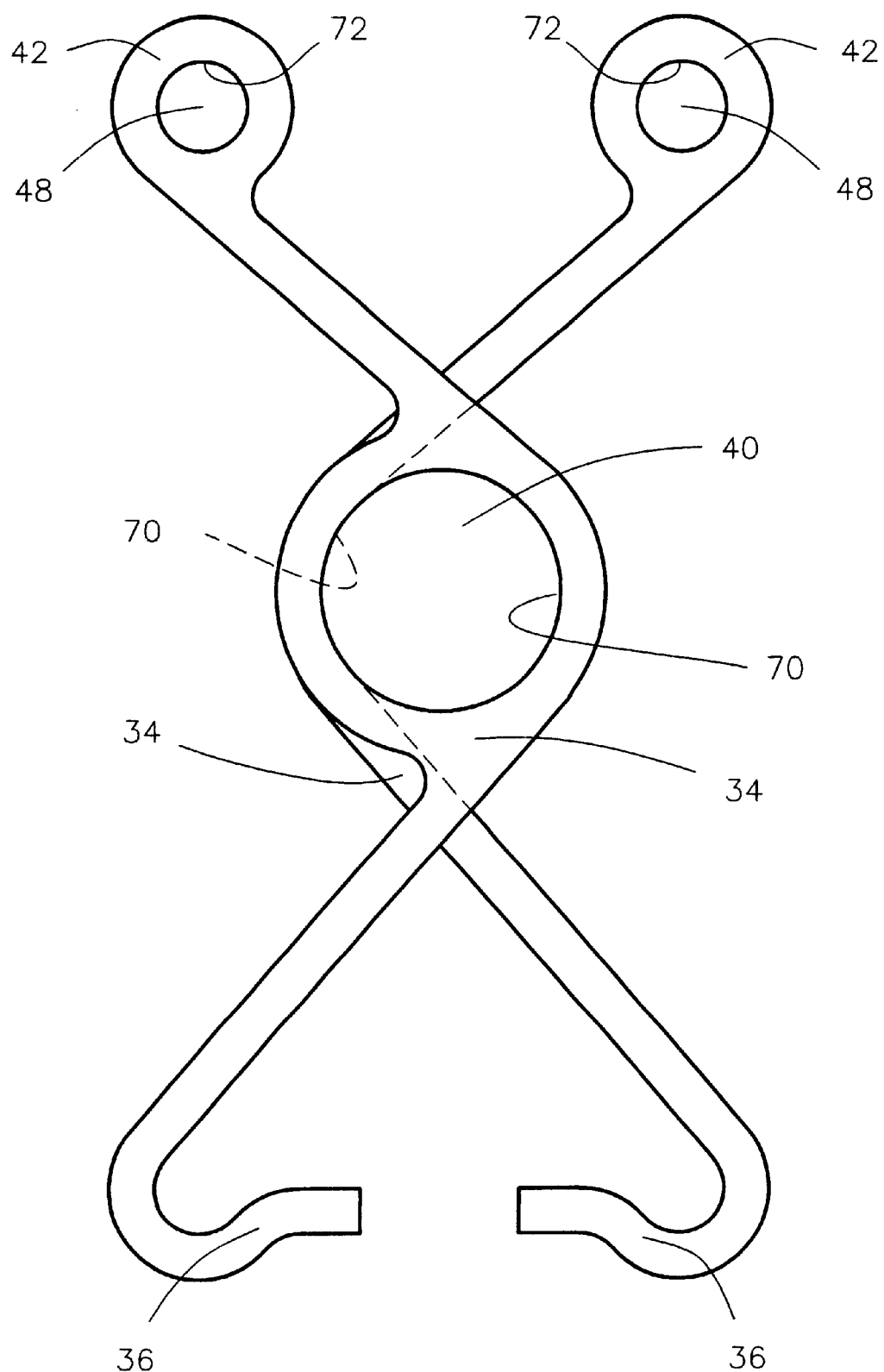
FIG. 5 is a top view of one alternative form of the tongs of the latched mechanism.

Referring now to FIG. 5 which illustrates one additional embodiment of the tongs 34, the tongs 34 may each be provided with journals 70, thereby permitting the restraining members 50 to be eliminated. Journals 70 may be formed into the input ends 42 of tongs 34 to fit over post 48 for simplicity in assembly and replacement of broken tongs 34.

The tongs 34 preferably are deflectable to a limited degree to accommodate the latching and unlatching forces without breakage and to provide the biasing forces necessary for a complete detenting action described above. By incorporating the biasing force capability into the tongs 34, the need for separate springs is eliminated and, consequently, simplifying the latch mechanism 24.

While the description of the invention has been made with reference to a transceiver module for purposes of the preferred embodiment, other electronic modules or devices may be latched by the use of this design of latch mechanism.

Each element of the invention is described with reference to at least one figure of the drawings and it should be understood that description is applicable to the same element in any figure, notwithstanding a lack of specific reference to the element in a particular figure.

The detailed description has been made for purposes of disclosure and may not be used to limit in any manner the scope of protection afforded by the attached claims which define the scope of the invention.

This description is made of the preferred embodiment of the invention but other embodiments of and modifications and changes to the described invention will come to mind of one skilled in the art, and the modifications and changes do not remove the resulting article from the scope of protection afforded the invention by the attached claims.

Those of skill in the art will recognize that changes and modifications may be made in the design of the latch mechanism and components thereof without the resulting device being removed from the scope of the invention as defined by the attached claims,

We claim:

1. A pull-to-release latch mechanism comprising:
    a grounding member for supporting said latch mechanism;
    a latching surface for engagement by said latch mechanism;
    a post extending from said grounding member, said post having a generally cylindrical shape;
    a latch actuator member movable relative to said grounding member;
    a pair of links, said links connected to said latch actuator member for pivotal movement relative to said latch actuator;
    a pair of latch arms engageable with said post and engageable with said latching surface, said engagement of said latch arms with said post constraining movement of said latch arms in an unlatching direction, absent movement of said latch actuator member
    said links each further connected to one of said latch arms for pivoting movement relative to said latch arms,
    said latch arms each comprising a latch surface extension and extending generally toward the other and forming latch arm latch surfaces for engagement with said latching surface, whereby motion of said latch actuator member away from said latch arms will pivotally transmit a force to said latch arms, pivoting said latch arms about said post and spreading said latch extensions to permit said latching surface to pass therebetween.

2. The pull-to-release latch mechanism of claim 1 wherein said latch arms form a partial cylindrical surface, said partial cylindrical surface engaging a complementing surface on said post.

3. The pull-to-release latch mechanism of claim 2 wherein said actuator member extends to a position which is manually accessible.

4. The pull-to-release latch mechanism of claim 1 wherein said latch arms form a tong arrangement with said post, forming a pivot of the tongs.

5. The pull-to-release latch mechanism of claim 1 wherein said latching surface is one surface of a member extending into a blocking position relative to said latch arm latch surface to prevent direct movement of said latch arm latch surfaces from an installed and latched position to a removed position of said latch mechanism relative to said latching surface.

6. The pull-to-release latch mechanism of claim 1 wherein movement of said actuator member toward said post said links acts to spread the points of said latch arms at which said links are attached and form an over-center toggle detent, locking said latch arm latch surfaces in the latching position.

7. A pull-to-release latch mechanism comprising:
    a grounding member for supporting said latch mechanism;
    a latching surface for engagement by said latch mechanism;
    a set of tongs having a latching surface on each of said tongs disposed on and supported by said grounding member;
    a control member displaceable relative to said grounding member and said tongs;
    a plurality of links interconnecting one of said tongs and said control member for transmittal of forces and motion from said control member to said tongs,
    whereby movement of said control member in a first direction creates movement of said tongs to release said latching surface and movement of said control member in an opposed second direction creates movement displacing tong latching surfaces into positions blocked by said latching surface.

8. The pull-to-release latch mechanism of claim 7 wherein said grounding member comprises an insertable module for insertion into a port of a host device.

9. The pull-to-release latch mechanism of claim 8 wherein said control member projects outwardly from said insertable module and comprises a gripping surface for manual engagement.

10. The pull-to-release latch mechanism of claim 9 wherein said plurality of links comprise a pair of linking members pivotally connected to said control member, and further having a combined length such that the distance between ends of said linking members connected to said tongs, whenever aligned with each other is greater than the distance between the points on said tongs at which said linking members are connected if said linking members are not deformed by forces thereon from said linking members, whereby said tongs are restricted to a range of motion sufficiently small that said tongs may not be fully disengaged from said latching surface without said control member being moved outwardly of said host device.

11. The pull-to-release latch mechanism of claim 10 wherein said latch surface is a surface of an open sided chamber in a rigid member of said host device.

12. The pull-to-release latch mechanism of claim 7 wherein said grounding member comprises a structure for forming a pivot around which said tongs may pivot.

13. The pull-to-release latch mechanism of claim 7 wherein said tongs are sized to provide a force threshold above which one or both of said tongs will break, thereby protecting said insertable module from damage.

14. The pull-to-release latch mechanism of claim 13 wherein said grounding member comprises a pivot axis forming a projection about which said tongs pivot and from which said tongs, said connected links and said control member may be removed without alteration of said projection.

15. The pull-to-release latch mechanism of claim 13 wherein said grounding member comprises a cavity and one of said tong members comprises a pivot axis forming projection insertable into said grounding member cavity.

16. The pull-to-release latch mechanism of claim 15 wherein said other of said tong members comprises an opening therein for accepting said projection and forming a pivot connection between said tongs, intermediate ends of said tong members.

17. A pull-to-release latch mechanism comprising:

an insertable module positionable within a port of a host device;

a manually moveable control carried by said insertable module;

said insertable module comprising a retaining surface;

a deflectable retention member disposed relative to said port and engageable by said retaining surface;

said manually moveable control comprising at least one surface engageable with said retention member for dislocating said retention member relative to said insertable module to release said insertable module for removal from said host device, and whereby said latch mechanism may be released and said module extracted from said host device by pulling said manually moveable control outwardly from said host device.

18. The pull-to-release latch mechanism of claim 17 wherein said manually moveable control is disposed within a slideway formed into said insertable module.

19. The pull-to-release latch mechanism of claim 17 wherein said manually moveable control comprises a restore member, said restore force engaged with said insertable module.

20. The pull-to-release latch mechanism of claim 17 wherein said manually moveable control comprises at least one surface forming a cam for forcing said retention member out of the path of said retention surface of said insertable module.

21. The pull-to-release latch mechanism of claim 20 wherein said retaining member is disposed on a distal end of a cantilevered deflectable beam extending from a portion of said host device.

22. The pull-to-release latch mechanism of claim 17 wherein said control further comprises a spring for urging said control to a position wherein said retention member is permitted to occupy a position juxtaposed to said retention surface, and said cam surface is effectively disengaged from said retention member.

23. The pull-to-release latch mechanism of claim 22 wherein said spring comprises at least a deflectable projection extending generally transverse to an axis of movement of said control member and engageable with a surface on said insertable module transverse to said axis of movement of said control member.

* * * * *